(12) United States Patent
Muchherla et al.

(10) Patent No.: US 11,676,664 B2
(45) Date of Patent: *Jun. 13, 2023

(54) VOLTAGE BIN SELECTION FOR BLOCKS OF A MEMORY DEVICE AFTER POWER UP OF THE MEMORY DEVICE

(71) Applicant: Micron Technology, Inc., Boise, ID (US)

(72) Inventors: Kishore Kumar Muchherla, Fremont, CA (US); Sampath K. Ratnam, Boise, ID (US); Shane Nowell, Boise, ID (US); Sivagnanam Parthasarathy, Carlsbad, CA (US); Mustafa N. Kaynak, San Diego, CA (US); Karl D. Schuh, Santa Cruz, CA (US); Peter Feeley, Boise, ID (US); Jiangang Wu, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,538

(22) Filed: Aug. 8, 2022

(65) Prior Publication Data

US 2022/0383955 A1    Dec. 1, 2022

Related U.S. Application Data

(63) Continuation of application No. 17/219,498, filed on Mar. 31, 2021, now Pat. No. 11,410,734.

(51) Int. Cl.
| | | |
|---|---|---|
| *G11C 16/34* | (2006.01) | |
| *G11C 16/10* | (2006.01) | |
| *G11C 16/20* | (2006.01) | |
| *G11C 16/32* | (2006.01) | |
| *G11C 16/30* | (2006.01) | |
| *G11C 16/26* | (2006.01) | |

(52) U.S. Cl.
CPC .......... *G11C 16/102* (2013.01); *G11C 16/20* (2013.01); *G11C 16/26* (2013.01); *G11C 16/30* (2013.01); *G11C 16/32* (2013.01); *G11C 16/3495* (2013.01)

(58) Field of Classification Search
CPC ....... G11C 16/102; G11C 16/20; G11C 16/26; G11C 16/30; G11C 16/32; G11C 16/3495; G11C 2211/5641; G11C 11/5642
See application file for complete search history.

(56) References Cited

U.S. PATENT DOCUMENTS

| | | |
|---|---|---|
| 9,691,485 B1 | 6/2017 | Kumar et al. |
| 11,217,320 B1 | 1/2022 | Sheperek et al. |
| 11,222,704 B1 | 1/2022 | Rayaprolu |
| 2018/0330793 A1 | 11/2018 | Tang et al. |
| 2020/0057572 A1 | 2/2020 | Lin |
| 2020/0211664 A1 | 7/2020 | Vashi et al. |
| 2022/0050777 A1 | 2/2022 | Sheperek et al. |
| 2022/0084605 A1 | 3/2022 | Muchherla et al. |
| 2022/0093168 A1 | 3/2022 | Chiang |

*Primary Examiner* — Jay W. Radke
(74) *Attorney, Agent, or Firm* — Lowenstein Sandler LLP

(57) ABSTRACT

A processing device of a memory sub-system is configured to detect a power on event that is associated with a memory device and indicates that power has been restored to the memory device; estimate a duration of a power off state preceding the power on event associated with the memory device; and update voltage bin assignments of a plurality of blocks associated with the memory device based on the duration of the power off state.

20 Claims, 8 Drawing Sheets

US 11,676,664 B2

VOLTAGE BIN SELECTION FOR BLOCKS OF A MEMORY DEVICE AFTER POWER UP OF THE MEMORY DEVICE

RELATED APPLICATIONS

This application is a continuation application of co-pending U.S. patent application Ser. No. 17/219,498, filed Mar. 31, 2021, each of which is incorporated herein by reference.

TECHNICAL FIELD

Embodiments of the disclosure are generally related to memory sub-systems, and more specifically, are related to managing voltage bin selection for blocks of a memory device after powering up the memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
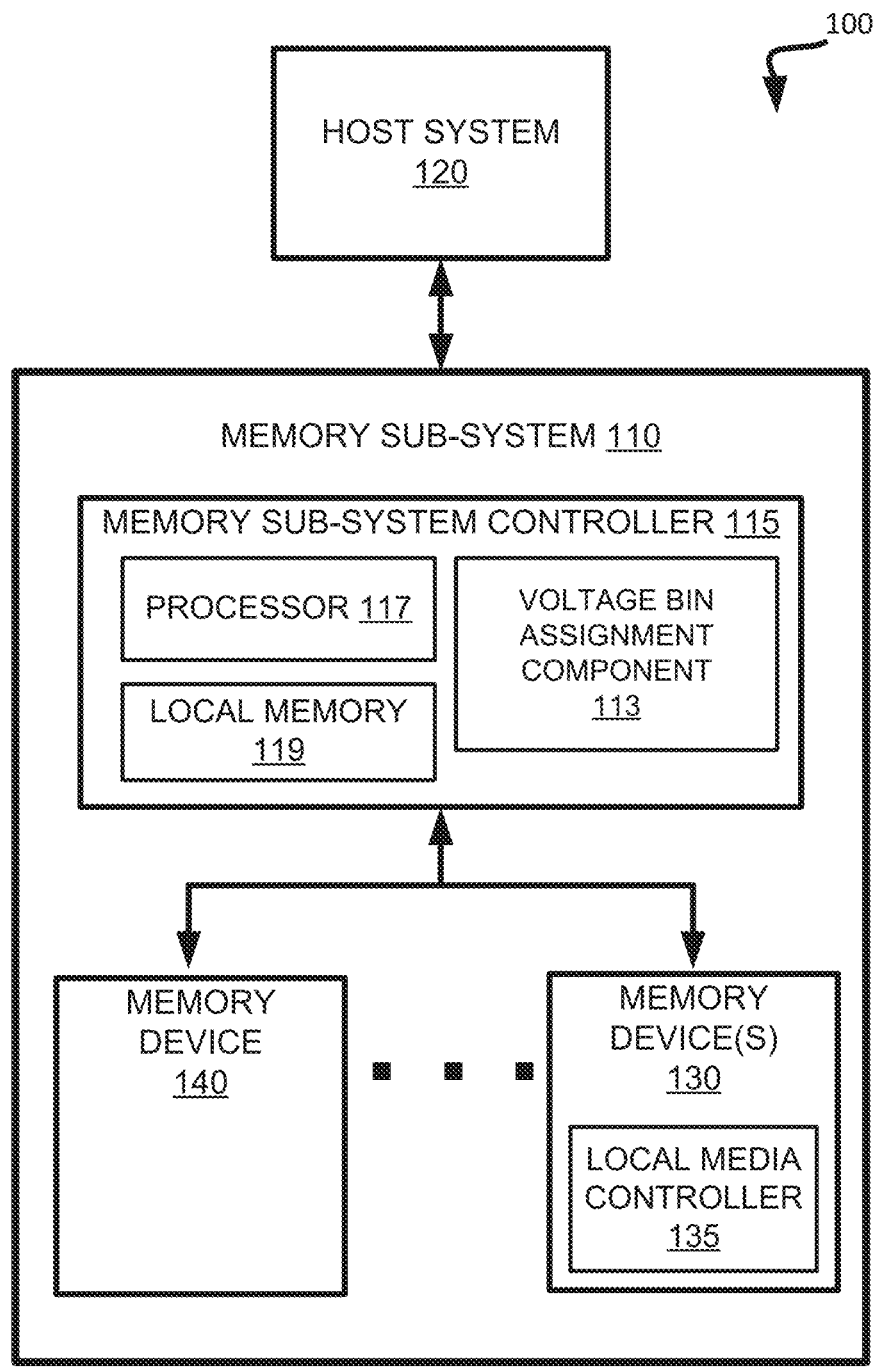
FIG. 1 illustrates an example computing system that includes a memory sub-system in accordance with some embodiments of the present disclosure.

Embodiments of the present disclosure are directed to selecting voltage bin for blocks of a memory device after power on of the memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. A "block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows the establishment of multiple threshold voltage levels corresponding to different logical levels, thus effectively allowing a single memory cell to store multiple bits of information: a memory cell operated with $2n$ different threshold voltage levels is capable of storing n bits of information. Thus, the read operation can be performed by comparing the measured voltage exhibited by the memory cell to one or more reference read voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs a set of read threshold voltage bins (herein after voltage bins) and assigning each block stored at the memory devices of the memory sub-system voltage one of the voltage bins, based on a time after program of each block. A voltage bin represents a set of read level threshold voltages that can be used to perform read operation at a given block, such that each read level threshold voltage corresponds to a valley, where each valley is a distance between two adjacent data states of the block to be read. For example, for TLC blocks storing 3 bits, there can be 8 data states (i.e., levels) and 7 valleys. Hence each voltage bin for TLC blocks has 7 offsets one for each valley. In some implementations, reads can be associated with pages and each page type corresponds to certain valleys. For the page reads, appropriate offsets are read from the bin that is assigned to the block containing the page. The one or more valleys of each page type are determined by the Gray code used to represent the levels. Gray code refers to a binary numeral system were two successive valleys differ in only one bit (e.g., binary digit). On TLC blocks, some parts of the block can be multi-level cell (MLC) storing 2 bits per memory cell (resulting in 4 data states), or single level cell (SLC) storing 1 bit per memory cell. For MLC and SLC parts, there can be 3 and 1 offset respectively. The associations of blocks with dies and with voltage bins can be stored in respective metadata tables maintained by the memory sub-system controller.

As explained above, the assignment of blocks of the memory device to voltage bins is based the time after programming (TAP) of each block, which is presumed to include the time elapsed after programming the block even when the memory device is powered off. Accordingly, in order to accurately assign a block to a voltage bin, the TAP of each block can be updated when the memory device is powered up after a power off state of the memory device to reflect the duration of the power off state. This can be done be scanning the blocks and estimating a new TAP for each block after the memory device is powered on. Scanning each block of the memory device after power on of the memory device, however, can introduce significant performance penalties to the memory device. Thus, embodiments of the present disclosure addresses this limitation by providing techniques to quickly estimate the duration of the power off state of the memory device and update voltage bin assignments to some or all the blocks of the memory device based on the estimated duration of the power off state, thus minimizing the performance issues of scanning every block of the memory device after a power on event of the memory device.

In accordance with embodiments of the present disclosure, a power on event of the memory device, indicating that power has been restored to the memory device, and a set of operations can be performed to estimate the time period within which the memory device was powered off prior to the power on event. In an embodiment, the power off duration can be estimated in order to update voltage bin assignment of the blocks of the memory device, while minimizing the number of blocks to be scanned for voltage bin selection of each block. In one embodiment, a subset of the blocks of the memory device can be scanned to determine the time after programming (TAP) associated with each block of the subset of blocks. Given that the TAP of each block includes both power on time of the memory device and power off time of the memory device, estimating a TAP of a given block after the power off time has ended, by scanning the block, can be used to estimate the power off time of the memory device.

In one embodiment, the duration of the power off state of the memory device can be estimated by identifying the oldest block that is assigned to the youngest voltage bin of the memory device before the power off state of the memory device. A youngest voltage bin herein can refer to a voltage bin having the shortest TAP values (e.g., in the range of minutes), such that a block of the memory device that has just been programmed can be assigned to the youngest voltage bin. Similarly, an older voltage bin can refer to a voltage bin having greater TAP values (e.g., in the range of days or weeks), such that a block of the memory device having a TAP of hours or days can be assigned to the older voltage bin. As time passes, due to charge loss and other factors, a programmed block can require a different read level threshold voltage for efficient read operations and thus a certain voltage bin can provide a certain read level threshold voltage to the block for read operations. As the read voltage change, the block also changes voltage bin assignments, such that the block is associated with a voltage bin having a read level threshold voltage that results in efficient read operations of data of the block, based on the TAP of the block.

A current age of the oldest block can then be determined, by performing a scan operation on the oldest block. If the current age of the block continues to fit within the range of TAP values of the youngest voltage bin, the duration of the power off state can be considered to be too short to cause the block to transition to an older voltage bin. Thus, the scanning process for voltage bin assignment of the remaining blocks of the memory device can be aborted.

On the other hand, if the current age of the oldest block does not match the youngest voltage bin but matches the voltage bin subsequent to the youngest voltage bin, the youngest block from the youngest voltage bin can be scanned in order to estimate the duration of the power off state. A current age of the youngest block based on the scanning results can be determined and if the current age of the youngest block also matches the second youngest voltage bin, the duration power off state can be estimated to be larger than the TAP range of the youngest bin but does not exceed the TAP range of the subsequent voltage bin. The TAP range of a voltage bin can refer to a set of TAP values that are used to determine the blocks to be assigned to the voltage bin, such that a block is assigned to the voltage bin when the TAP of the block matches one of the TAP values associated with the voltage bin. In this case, all blocks of the youngest voltage bin can be assigned to the subsequent voltage bin and a scan operation of a subset of blocks originally assigned to the subsequent voltage bin can be performed to determine if they were transitioned to the next voltage bin. In one embodiment, scan operations for blocks assigned to voltage bins older than the subsequent voltage bin can be skipped.

On the other hand, if the current age of the youngest block does not match the second youngest voltage bin but rather continues to match the TAP range of the youngest voltage bin, the duration of the power off state can be determined to be shorter than the time range of the youngest voltage bin. Scan operations for blocks assigned to voltage bins older than the youngest voltage bin can then be skipped. Additionally, blocks of the youngest voltage bin can be scanned to determine a current age of each block and assign a voltage bin accordingly, as explained in more details herein below.

In certain embodiments, after determining the current age of the oldest block of the youngest voltage bin, the oldest block of the youngest voltage bin can be determined to have transitioned to an older voltage bin that is not adjacent to the youngest voltage bin (e.g., oldest block has transitioned from Bin K to Bin N, where N>K−1>=0). In this case, the duration of the power off state can be determined as being long enough to cause a block to transition from Bin 0 to Bin N. Blocks that are currently assigned to bins Bin 0 to Bin N−1 can be assigned to Bin N, without performing further scan operations. Additionally, blocks of voltage bin N can be scanned to determine if any blocks from voltage bin N has transitioned to voltage bin N+1, as explained in more details below.

In yet another embodiment, the duration of the power off state of the memory device can be estimated by determining a current age of the youngest block of the youngest voltage bin of the memory device, by performing a scan operation of the youngest block assigned to the youngest voltage bin for example. Since the youngest block of the youngest voltage bin can be interpreted to have the shortest TAP of the blocks of the memory device before the power off state occurs, the current age of the youngest block can be considered to approximately represent the duration of the power off state of the memory device. The estimated duration of the power off state can then be added as an offset to the stored age of each block of the memory device without scanning further blocks. Voltage bins can then be assigned to blocks of the memory device based on the updated ages of the blocks of the memory device.

Therefore, advantages of the systems and methods implemented in accordance with some embodiments of the present disclosure include, but are not limited to, optimizing the performance of voltage bin selection process after a power on of the memory device, such that voltage bin assignment to blocks of the memory device is updated while minimizing performance overhead on the memory sub-system. Because a memory sub system can track TAP as well as voltage bin assignment of each block right before power loss of a memory device, heuristics data of the blocks can be used to quickly update voltage bin assignment for bocks of the memory device with speed given more priority over accuracy at the time of powering on of the memory device, thus improving the performance of the power on process of the memory device. A finer granularity search algorithm can be performed during a regular, predetermined scan schedule to more accurately assign blocks to voltage bins of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a voltage bin assignment component 113, which can be used to implement techniques for assigning voltage bins to blocks of a memory device 130-140 after a power up of memory device 130-140 based on heuristic data of the blocks, in accordance with embodiments of the present disclosure. In one implementation, heuristic data can refer to one or more properties of the blocks that were captured and stored in memory device 130-140 before the occurrence of a power off event of memory device 130-140 (e.g., voltage bin assignment of each block, a corresponding time after program (TAP) of each block, etc.) In one implementation, voltage bin assignment component 113 can detect that memory device 130-140 has been powered on after a period of power off of memory device 130-140. In an implementation, voltage bin assignment component 113 can detect a power on event of the memory device by receiving a hardware or software notification from an initialization module of memory device 130-140 indicating that memory device 130-140 is being powered on or that power is being restored to memory device 130-140. Voltage bin assignment component 113 can perform a set of operations to estimate the time period within which memory device 130-140 was powered off prior to the power on event. In an implementation, voltage bin assignment component 113 can estimate the power off duration in order to update voltage bin assignment of the blocks of the memory device based on the power off duration of memory device 130-140 while minimizing the number of blocks to be scanned for voltage bin selection of each block. As an example, a power off duration that is in the range of a few minutes may impact voltage bin assignment for blocks assigned to younger voltage bins having a TAP range of several minutes, but can have minimal to no impact on voltage bin assignments for blocks assigned to older voltage bins having a TAP range of hours or days. In this case, voltage bin assignment component 113 can perform scan operations on blocks assigned to younger voltage bins while skipping the scan operations for blocks assigned to older voltage bins because the power off time is too small to impact the existing voltage bin assignments of the blocks in the older voltage bins, as explained in more details herein below.

In one implementation, scanning a block of the memory device can refer to performing read operations on the block using read level voltage offsets associated with a given voltage bin and subsequently determining one or more reliability statistics based on the read operations of the block. One example of a reliability statistic is raw bit error rate (RBER). The RBER corresponds to a number of bit errors per codeword that the data stored at the block experiences. A codeword may refer to the smallest read unit allowed. Voltage bin assignment component 113 can perform a second set of read operations using read level voltage offsets associated with a second voltage bin, and a corresponding second RBER is determined based on the second set of read operations. In this case, voltage bin assignment component 113 can select the voltage bin associated with the smallest RBER and can assign the selected bin to the block.

In some implementations, voltage bin assignment component 113 can scan a subset of the blocks of memory device 130-140 to determine an age associated with each block of the one or more blocks. as an example, the age of the each block can be represented by a time after programming (TAP) of the block. Because the TAP of each block includes both power on time of the memory device and power off time of the memory device, determining a TAP of a given block after the power off time has ended, e.g., by scanning the block, can be used to estimate the power off time of memory device 130-140. In one implementation, voltage bin assignment component 113 can estimate the duration of the power off state of memory device 130-140 by identifying an oldest block that is assigned to the youngest voltage bin of memory device 130-140 before the power off state of the memory device. Voltage bin assignment component 113 can then determine a current age of the oldest block, by performing a scan operation on the oldest block. If the current age of the block continues to fit within the youngest voltage bin (e.g., the current age of the block is within the range of TAP values of the youngest voltage bin), voltage bin assignment component 113 can determine that the duration of the power off state was too short to cause the block to transition to an older voltage bin. Thus, voltage bin assignment component 113 can abort the scanning process for voltage bin assignment of the remaining blocks of the memory device 130-140.

On the other hand, if voltage bin assignment component 113 determines that the current age of the oldest block does not match the youngest voltage bin but matches the voltage bin subsequent to the youngest voltage bin (e.g., matches the second youngest voltage bin), voltage bin assignment component 113 can scan other blocks from the youngest voltage bin in order to estimate the duration of the power off state. In one implementation, voltage bin assignment component 113 can scan the youngest block that is assigned to the youngest voltage bin of memory device 130-140 before the power off state of the memory device. Voltage bin assignment component 113 can then determine a current age of the youngest block based on the scanning results. If the current age of the youngest block also matches the second youngest voltage bin, voltage bin assignment component 113 can determine that since the oldest block of the youngest voltage bin and the youngest block of the youngest voltage bin have transitioned to the subsequent voltage bin, the duration power off state can be larger than the time range of the youngest bin but does not exceed the time range of the subsequent voltage bin. In this case, voltage bin assignment component 113 can assign all blocks of the youngest voltage bin to the subsequent voltage bin and can perform a scan of a subset of blocks originally assigned to the subsequent voltage bin, to determine if they were transitioned to the next voltage bin. Voltage bin assignment component can then skip scan operations for blocks assigned to voltage bins older than the subsequent voltage bin.

If the current age of the youngest block does not match the second youngest voltage bin but rather continues to match the TAP range of the youngest voltage bin, voltage bin assignment component 113 can determine that the duration of the power off state does not exceed the time range of the youngest voltage bin. Voltage bin assignment component 113 can then skip scan operations for blocks assigned to voltage bins older than the youngest voltage bin. Voltage bin assignment component 113 can also scan blocks of the youngest voltage bin to determine a current age of each block and assign a voltage bin accordingly.

In certain implementations, after determining the current age of the oldest block of the youngest voltage bin, voltage bin assignment component 113 can determine that the oldest block of the youngest voltage bin has transitioned to an older voltage bin that is not adjacent to the youngest voltage bin. As an example, voltage bin assignment component 113 can determine that the oldest block has transitioned from Bin 0 to Bin N. In this case, voltage bin assignment component 113 can determine that the duration of the power off state was long enough to cause a block to transition from bin 0 to bin N. Voltage bin assignment component 113 can then assign to Bin N blocks that are currently assigned to bin 0 to bin N−1, without performing further scans. Voltage bin assignment component 113 can also scan blocks of voltage bin N to determine if any blocks from voltage bin N has transitioned to voltage bin N+1, as explained in more details herein below.

In yet another implementation, voltage bin assignment component 113 can estimate the duration of the power off state of memory device 130-140 by determining a current age of the youngest block of the youngest voltage bin of memory device 130-140, by performing a scan operation of the youngest block assigned to the youngest voltage bin for example. Since the youngest block of the youngest voltage bin can be interpreted to have the shortest TAP of the blocks of the memory device before the power off state occurs, voltage bin assignment component 113 can determine that the current age of the youngest block approximately represents the duration of the power off state of memory device 130-140. Voltage bin assignment component 113 can then add the determined duration of the power off state as an offset to the stored age of each block of memory device 130-140 without scanning further blocks. Voltage bin assignment component 113 can then assign voltage bins to blocks of memory device 130-140 based on the updated ages of the blocks of memory device 130-140.

Figure 2:
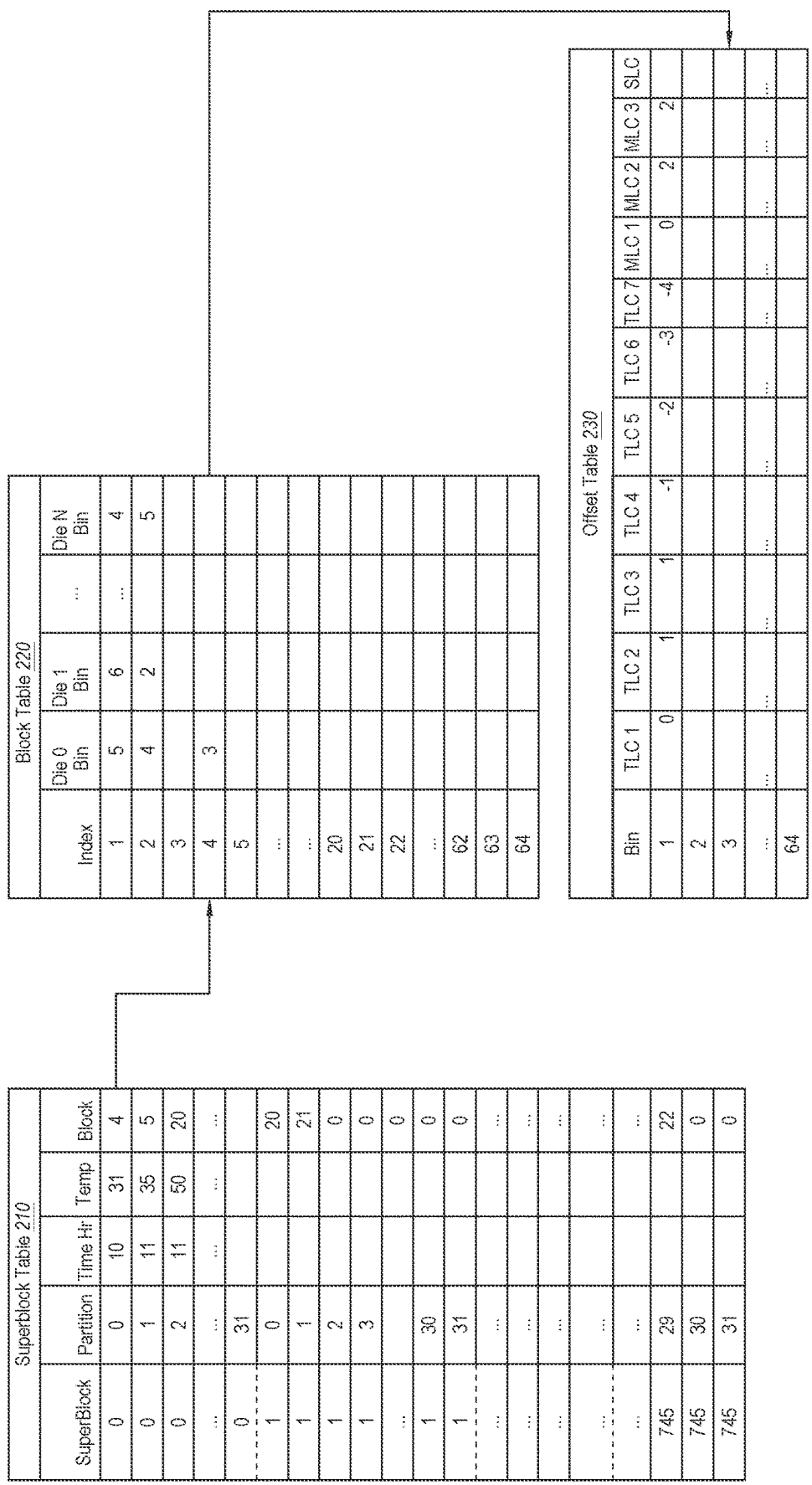
FIG. 2 schematically illustrates example metadata maintained by the memory sub-system controller for associating blocks with voltage bins, in accordance with embodiments of the present disclosure.

FIG. 2 schematically illustrates example metadata maintained by the memory sub-system controller for associating blocks and/or partitions with voltage bins, in accordance with embodiments of the present disclosure. As schematically illustrated by FIG. 2, the memory sub-system controller can maintain the superblock table 210, the block table 220, and the offset table 230.

Each record of the superblock table 210 specifies the block associated with the specified superblock and partition combination. In some implementations, the superblock table records can further include time and temperature values associated with the specified superblock and partition combination.

The block table 220 is indexed by the block number, such that each record of the block table 220 specifies, for the block referenced by the index of the record, a set of voltage bins associated with respective dies of the block. In other words, each record of the block table 220 includes a vector, each element of which specifies the voltage bin associated with the die referenced by the index of the vector element.

Finally, the offset table 230 is indexed by the bin number. Each record of the offset table 230 specifies a set of threshold voltage offsets (e.g., for TLC, MLC, and/or SLC) associated with voltage bin.

The metadata tables 210-230 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 210 is used to identify the block family identifier corresponding to the physical block number; then, the block identifier is used as the index to the block table 220 in order to determine the voltage bin associated with the block and the die; finally, the identified voltage bin is used as the index to the offset table 230 in order to determine the threshold voltage offset corresponding to the bin. The memory sub-system controller can then additively apply the identified threshold voltage offset to the base voltage read level in order to perform the requested read operation.

In the illustrative example of FIG. 2, the superblock table 210 maps partition 0 of the superblock 0 to block 4, which is utilized as the index to the block table 220 in order to determine that die 0 is mapped to voltage bin 3. The latter value is used as the index to the offset table in order to determine the threshold voltage offset values for voltage bin 3.

Figure 3A:
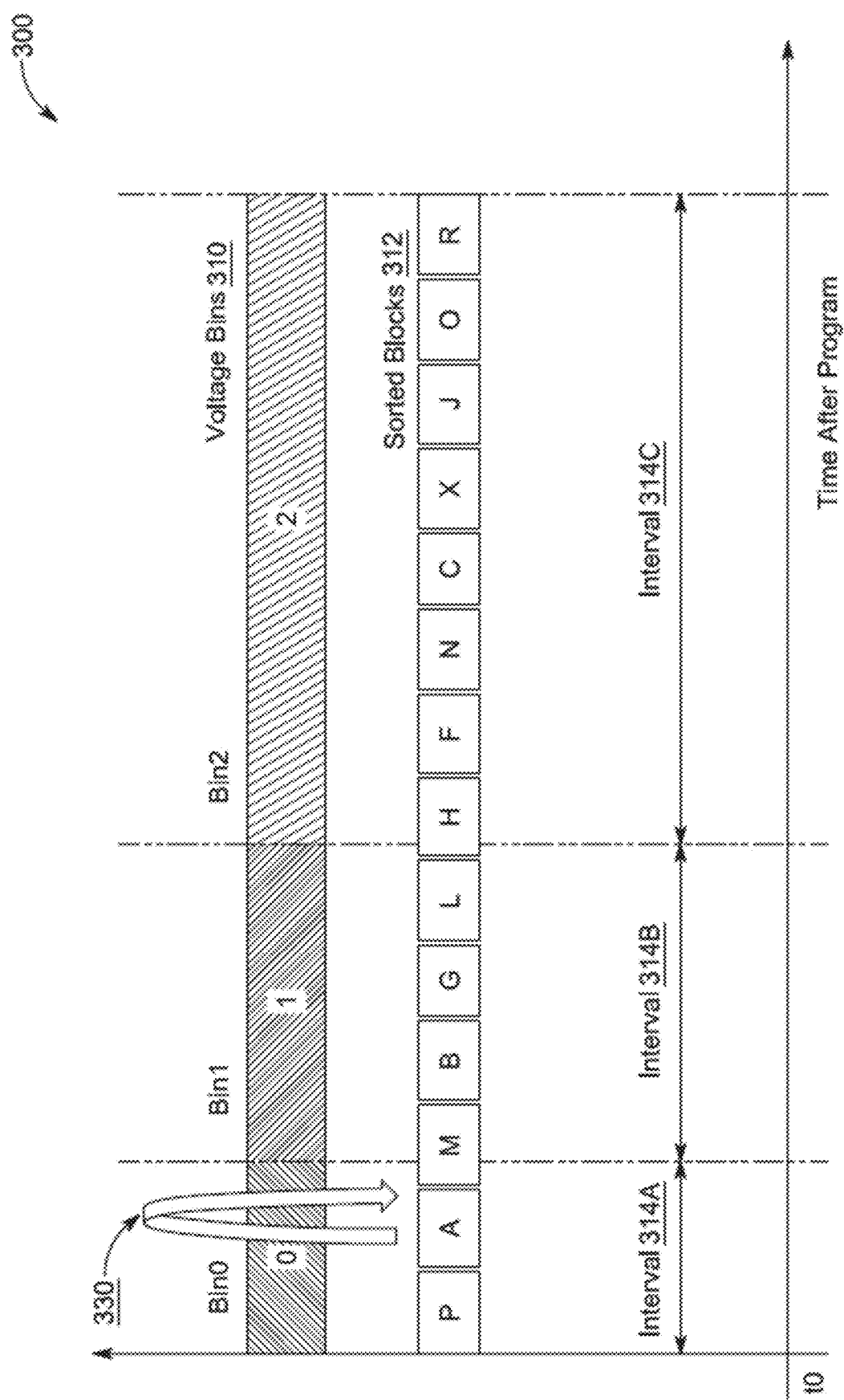
FIG. 3A depicts a block diagram illustrating an example method of voltage bin selection for blocks of a memory device after power up of the memory device, in accordance with one or more aspects of the present disclosure.

FIG. 3A depicts a block diagram illustrating an example method 300 of voltage bin selection for blocks of a memory device after power up of the memory device, in accordance with one or more aspects of the present disclosure. Method 300 may be performed by processing logic that includes hardware (e.g., circuitry, dedicated logic, programmable logic, microcode, etc.), software (e.g., instructions run on a processor to perform hardware simulation), or a combination thereof. In some embodiments, the method 300 is performed by voltage bin assignment component 113 of FIG. 1. In one implementation, a memory device containing sorted blocks 312 and voltage bins 310 can be powered on after a duration of a power off state of the memory device. Sorted blocks 312 can be sorted by a time after program (TAP) of each block and each block of sorted blocks 312 can be assigned one of voltage bin Bin0, Bin1, or Bin2 before the memory device enter the power off state. The voltage bin assignment can be based on the TAP of each block, such that a block is assigned to Bin0 if the TAP of the block is within interval 314A, a block is assigned to Bin1 if the TAP of the block is within interval 314B, and a block is assigned to Bin2 if the TAP of the block is within or greater than interval 314C.

At operation 330, the processing logic can detect that the memory device is powered on after a period of a power off state of the memory device. In one implementation, the processing logic can detect the power on event of the memory device after receiving a hardware or software notification from an initialization module of the memory device indicating that memory device is being powered on. The processing logic can then identify an oldest block "A" that is assigned to Bin0 and can proceed to scan block A to determine whether or not block A has transitioned to another voltage bin of voltage bins 310. In one implementation, the processing logic can determine a current TAP of block A based on the scan operation. When the processing logic determines that the current TAP of Block A is still within interval 314A, the processing logic determines that the duration of the power off state is likely shorter than interval 314A. the processing logic then aborts the scanning process for remaining sorted blocks 312 since the duration of the power off state is unlikely to have caused a voltage bin transition in older blocks of the memory device.

Figure 3B:
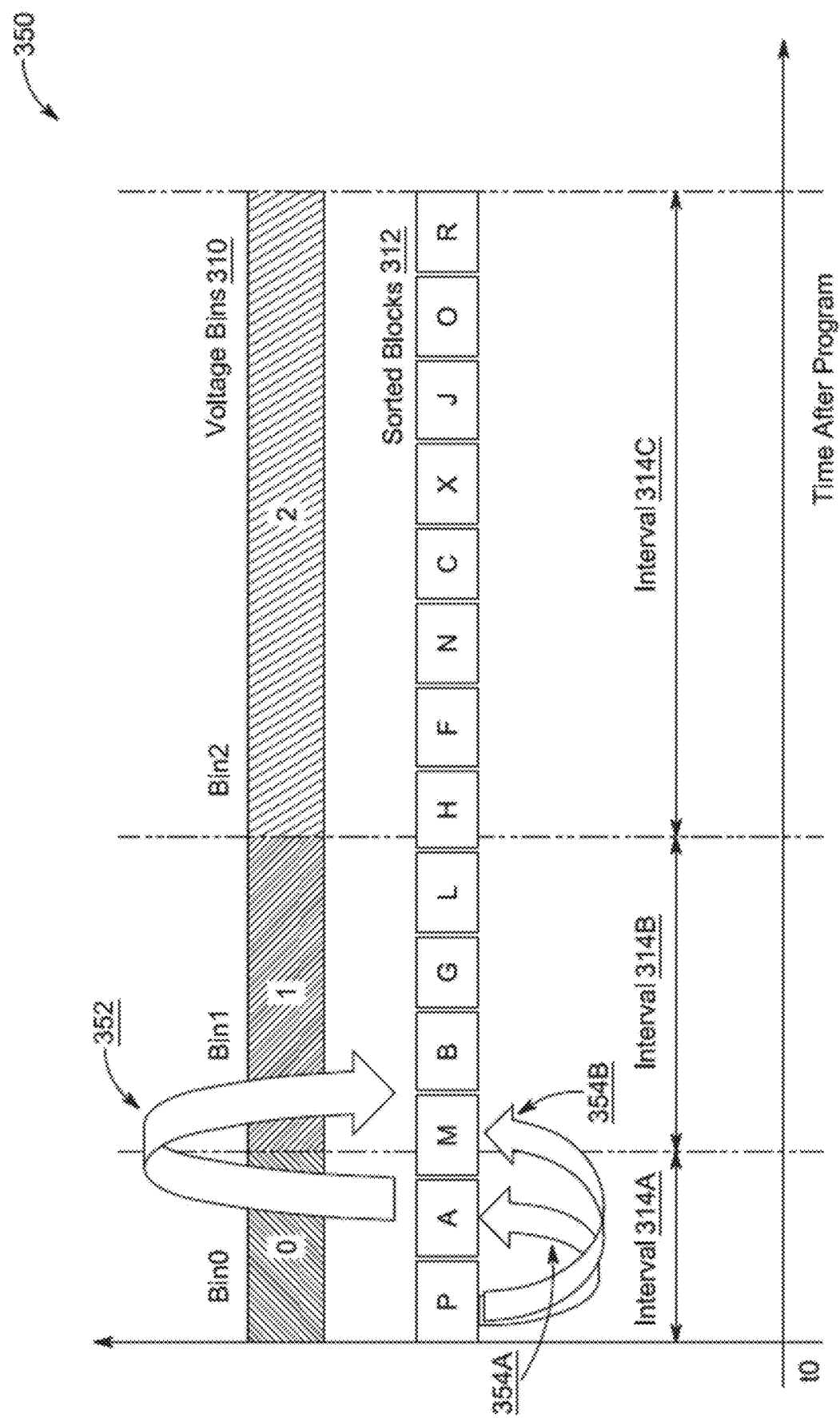
FIG. 3B depicts a block diagram illustrating an example method of voltage bin selection for blocks of a memory device after power up of the memory device based on block transitions between adjacent voltage bins, in accordance with one or more aspects of the present disclosure.

FIG. 3B depicts a block diagram illustrating an example method 300 of voltage bin selection for blocks of a memory device after power up of the memory device based on block transitions between adjacent voltage bins, in accordance with one or more aspects of the present disclosure. Method 300 may be performed by processing logic that includes hardware (e.g., circuitry, dedicated logic, programmable logic, microcode, etc.), software (e.g., instructions run on a processor to perform hardware simulation), or a combination thereof. In some embodiments, the method 300 is performed by voltage bin assignment component 113 of FIG. 1. In one implementation, a memory device containing sorted blocks 312 and voltage bins 310 can be powered on after a duration of a power off state of the memory device. Sorted blocks 312 can be sorted by a time after program (TAP) of each block and each block of sorted blocks 312 can be assigned one of voltage bin Bin0, Bin1, or Bin2 before the memory device enter the power off state. The voltage bin assignment can be based on the TAP of each block, such that a block is assigned to Bin0 if the TAP of the block is within interval 314A, a block is assigned to Bin1 if the TAP of the block is within interval 314B, and a block is assigned to Bin2 if the TAP of the block is within or greater than interval 314C.

The processing logic can detect that the memory device is powered on after a period of a power off state of the memory device and can then identify oldest block "A" that is assigned to Bin0 and can proceed to scan block A to determine whether or not block A has transitioned to another voltage bin of voltage bins 310. At operation 352, the processing logic can determine a current TAP of block A based on the scan operation. When the processing logic determines that the current TAP of Block A has transitioned from interval 314A to interval 314B, the processing logic determines that the duration of the power off state of the memory device is likely greater than interval 314A but shorter than interval 314B. The processing logic then proceeds to scan more blocks of sorted blocks 312 to further estimate a more accurate duration of the power off state of the memory device. The processing logic also aborts scanning operations for blocks assigned to Bin2 of voltage bins 310 since the duration of the power off state is unlikely to affect voltage bin assignments of the older blocks in voltage bin Bin2.

At operation 354A, the processing logic scans the youngest block that is assigned to Bin0 (block P) before the power off state of the memory device, to determine the current age of block P after the power on event of the memory device. When the processing logic determines that the current TAP of Block P is still within interval 314A, the processing logic determines that the duration of the power off state of the memory device is likely shorter than interval 314A. The processing logic then skip scan operations for blocks assigned to voltage bins Bin1 and Bin2. The processing logic also scans additional blocks of Bin0 to determine the blocks that has transitioned to Bin1. As an example, the processing logic can scan sorted blocks that are assigned to Bin0, from the youngest block to the oldest block. When the processing logic reaches the oldest block that remains in Bin0, the processing logic can designate that oldest block as a boundary block and can assign the blocks older than the boundary block to Bin1, without further scanning of the older blocks.

Alternatively, at operation 354B, the processing logic scans the youngest block that is assigned to Bin0 (block P) before the power off state of the memory device and determines that the current TAP of Block P has transitioned to interval 314B. The processing logic then determines that since both block A and block P of Bin0 has transitioned to Bin1, the duration power off state is likely greater than interval 314A but does not exceed interval 314B. The processing logic then assign all blocks of Bin0 to Bin 1. The processing logic also repeats operations 312-314B on a subset of blocks originally assigned to Bin1 to determine if they are transitioned to Bin2. The processing logic skip scan operations for blocks assigned to Bin2 of voltage bins 310.

Figure 4:
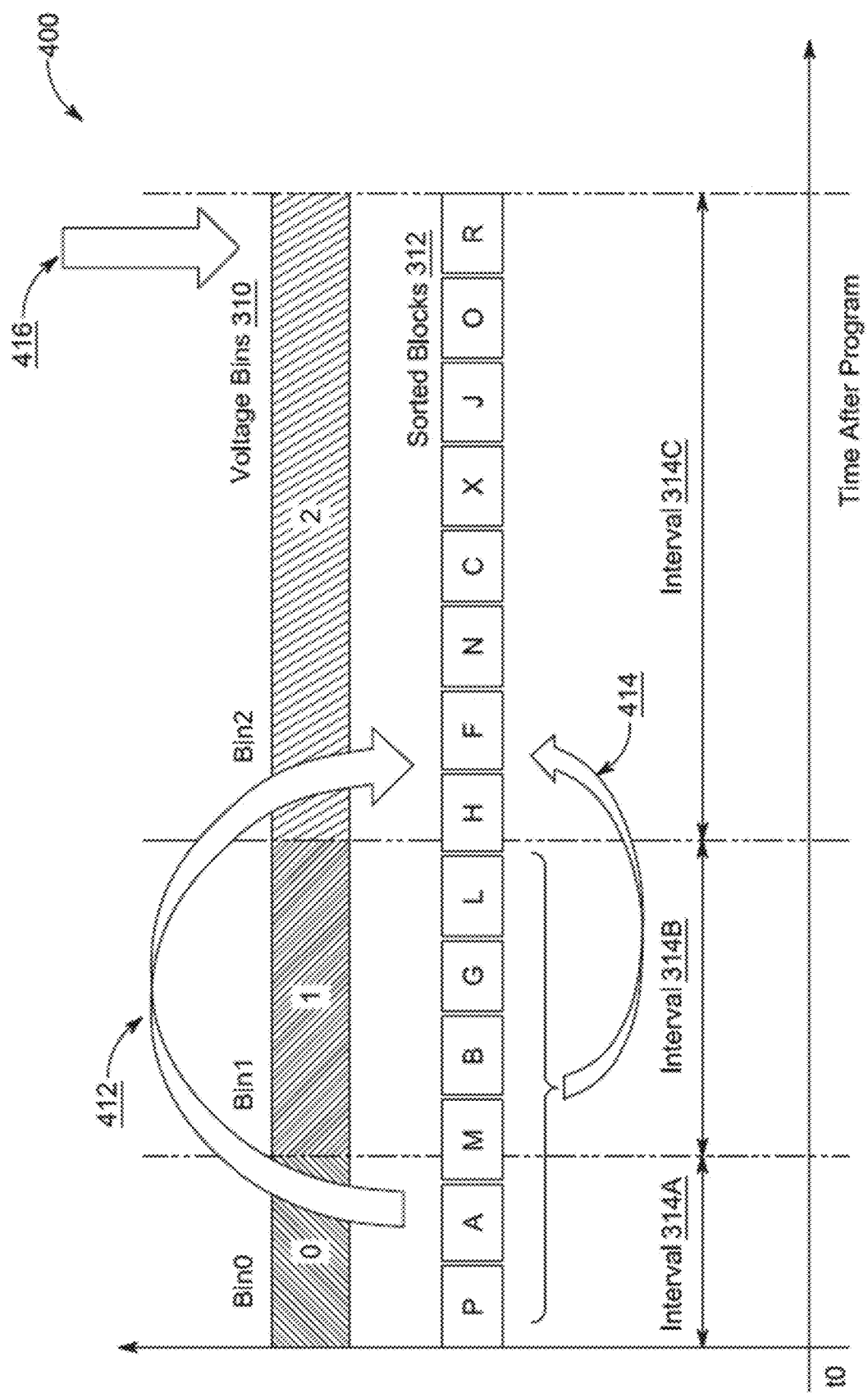
FIG. 4 depicts a block diagram illustrating an example method of voltage bin selection for blocks of a memory device after power up of the memory device based on block transitions between non-adjacent voltage bins, in accordance with one or more aspects of the present disclosure.

FIG. 4 depicts a block diagram illustrating an example method 400 of voltage bin selection for blocks of a memory device after power up of the memory device based on block transitions between non-adjacent voltage bins, in accordance with one or more aspects of the present disclosure. Method 400 may be performed by processing logic that includes hardware (e.g., circuitry, dedicated logic, programmable logic, microcode, etc.), software (e.g., instructions run on a processor to perform hardware simulation), or a combination thereof. In some embodiments, the method 400 is performed by voltage bin assignment component 113 of FIG. 1. In one implementation, a memory device containing sorted blocks 312 and voltage bins 310 can be powered on after a duration of a power off state of the memory device. Sorted blocks 312 can be sorted by a time after program (TAP) of each block and each block of sorted blocks 312 can be assigned one of voltage bin Bin0, Bin1, or Bin2 before the memory device enter the power off state. The voltage bin assignment can be based on the TAP of each block, such that a block is assigned to Bin0 if the TAP of the block is within interval 314A, a block is assigned to Bin1 if the TAP of the block is within interval 314B, and a block is assigned to Bin2 if the TAP of the block is within or greater than interval 314C.

Similar to FIG. 3B, the processing logic can detect that the memory device is powered on after a period of a power off state of the memory device and can then identify oldest block "A" that is assigned to Bin0 and can proceed to scan block A to determine whether or not block A has transitioned to another voltage bin of voltage bins 310. At operation 412, the processing logic can determine a current TAP of block A based on the scan operation. When the processing logic determines that the current TAP of Block A has transitioned from interval 314A to interval 314C of Bin2, the processing logic determines that the duration of the power off state of the memory device is likely greater than interval 314B. The processing logic then proceeds to adjust voltage bin assignment of sorted blocks 312 based on the estimated duration of the power off state of the memory device.

At operation 414, given that the estimated duration of power off state is greater than interval 314B of Bin1, the processing logic determines that blocks of Bin0 and Bin1 have a current age that is greater than interval 314B. The processing logic then assigns to Bin 2 blocks of Bin0 and blocks of Bin1 without scanning the blocks of Bin0 and Bin1. At operation 416, the processing logic repeats operations 352-354B of FIG. 3B on a subset of blocks originally assigned to Bin2, in order to determine if some of the blocks have transitioned to a subsequent voltage bin, as explained in more details herein with respect to FIG. 3B.

Figure 5:
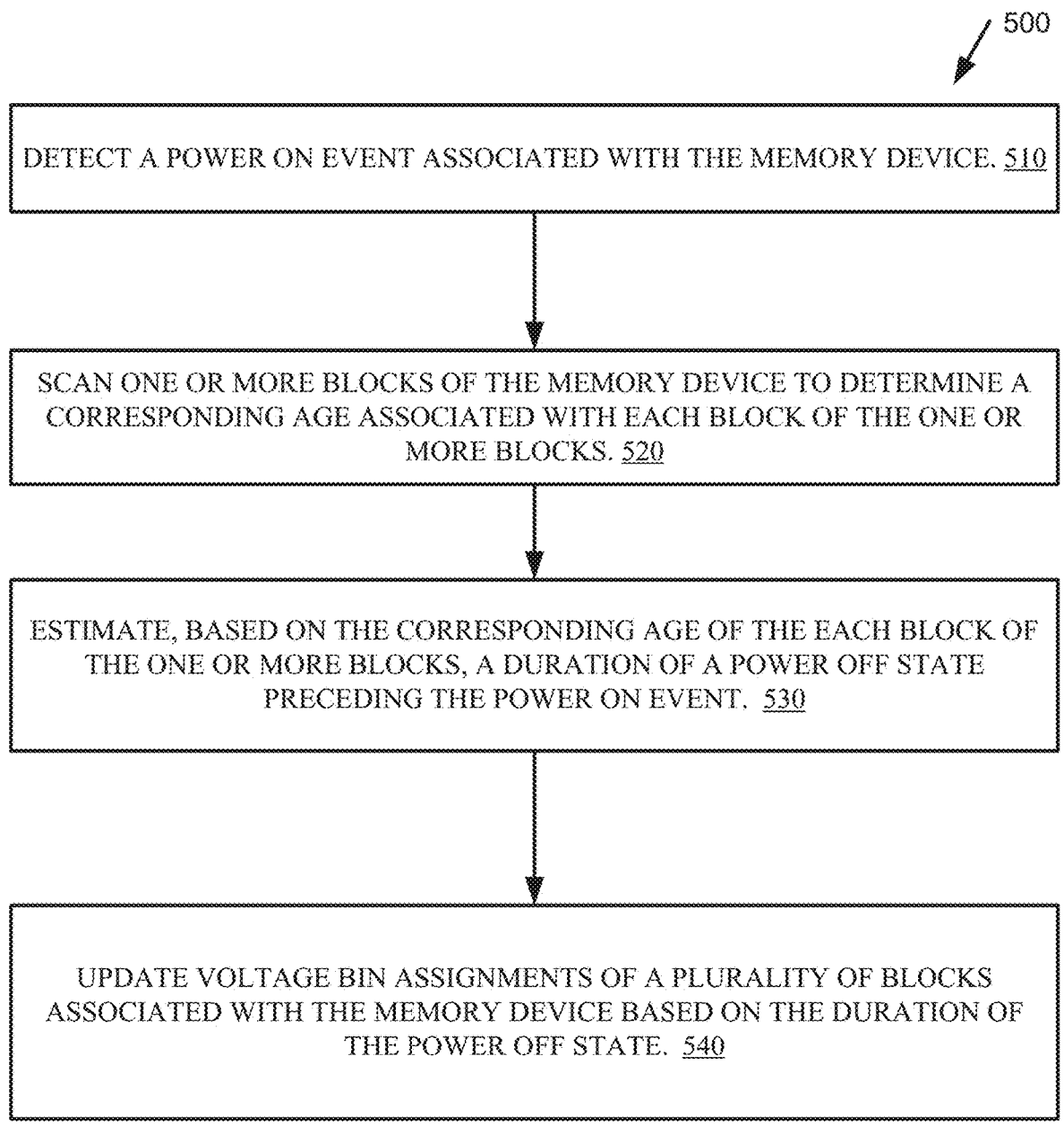
FIG. 5 is a flow diagram of an example method of voltage bin selection for blocks of a memory device after a power on event of the memory device using heuristic data of the blocks, in accordance with some embodiments of the present disclosure.

FIG. 5 is a flow diagram of an example method of voltage bin selection for blocks of a memory device after a power on event of the memory device using heuristic data of the blocks, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the voltage bin assignment component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 510, the processing logic detects a power on event associated with a memory device. In an implementation, the power on event can refer to a power restore of the memory device or a power switch of the memory device being turned on. The processing logic can then perform certain operations to estimate the duration of a power off state of the memory device to update voltage bin assignment of blocks of the memory device based on the duration of the power off state, as explained in more details above.

At operation 520, the processing logic scans a subset of blocks of the memory device to determine a corresponding current age of each block after the occurrence of the power on event. In an implementation, a current age of a block of the memory device can refer to a time after programming (TAP) of the block. The current age of the block can determine a corresponding voltage bin that matches the current age of the block, as explained in more details herein.

At operation 530, the processing logic estimates a duration of the power off state of the memory device that preceded the power on event. The processing logic estimates the duration of the power off state based on the current ages of the one or more scanned blocks. in an implementation, the processing logic estimates the duration of a power off state based on whether or not blocks of the memory device has transitioned from a first voltage bin to a second voltage bin during the power off state of the memory device, as explained in more details herein above.

At operation 550, given the estimated duration of the power off state of the memory device, the processing logic updates voltage bin assignments of the blocks of the memory device based on the estimated duration of the power off state, without scanning additional blocks of the memory device. In an implementation, the processing logic can update voltage bin assignment of blocks assigned to younger voltage bins when the duration of the power off state is shorter than a threshold. On the other hand, the processing logic can update voltage bin assignments of blocks assigned to each voltage bin when the duration of the power off state is longer than a second threshold, as explained in more details herein above.

Figure 6:
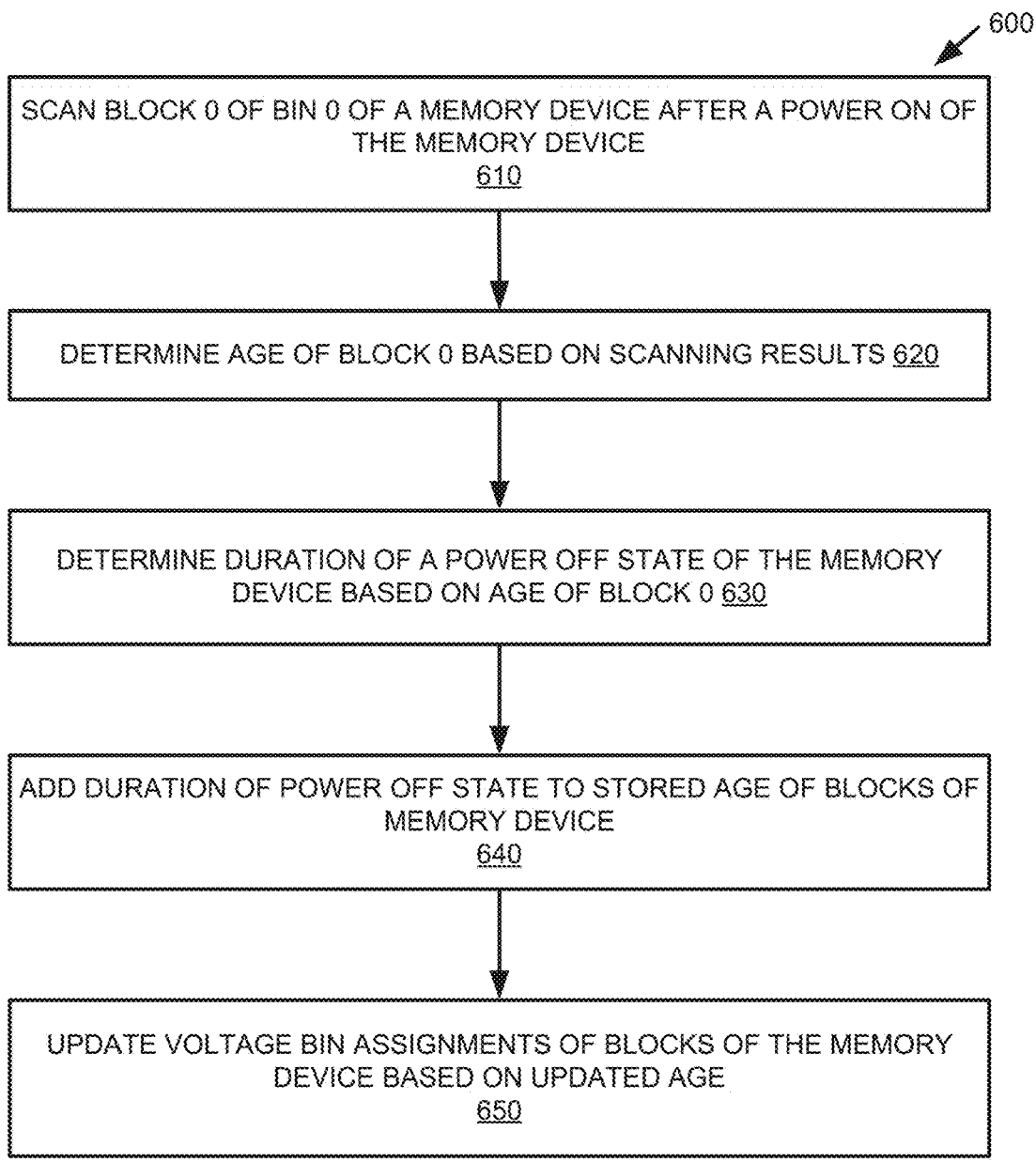
FIG. 6 is a flow diagram of an example method of performing voltage bins selection for blocks of a memory device after a power on event, based on an offset representing the duration of a power off state of the memory device, in accordance with some embodiments of the present disclosure.

FIG. 6 is a flow diagram of an example method of performing voltage bins selection for blocks of a memory device after a power on event, based on an offset representing the duration of a power off state of the memory device, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the voltage bin assignment component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 610, the processing logic the processing logic detects a power on event associated with a memory device and accordingly scans block 0 of bin 0 of the memory device. In an implementation, block0 can be the youngest block of bin 0 and bin 0 can be the youngest voltage bin of the memory device. At operation 620, the processing logic can determine a current age of block 0 after the power on event and based on the scanning results, as explained in more details herein above.

At operation 630, the processing logic determines the duration of the power off state of the memory device based on the current age of block 0. In one implementation, since block 0 as the youngest block of the youngest voltage bin have the shortest TAP of the blocks of the memory device before the power off state occurs, the processing logic determines that the current age of block 0 approximately represents the duration of the power off state of memory device.

At operation 640, the processing logic adds the determined duration of the power off state as an offset to the stored age of each block of the memory device, without having to scan the blocks to determine an actual current age, thus reducing time and bandwidth of further scan operations. The processing logic then, at operation 650, updates the voltage bin assignment of the blocks of the memory device based on the updated age of the blocks of the memory device. As an example, for each block of the blocks of the memory device, the processing logic selects a voltage bin to assign to the block such that the range of TAP values of the selected voltage bin includes the updated age of the block, as explained in more details herein above.

Figure 7:
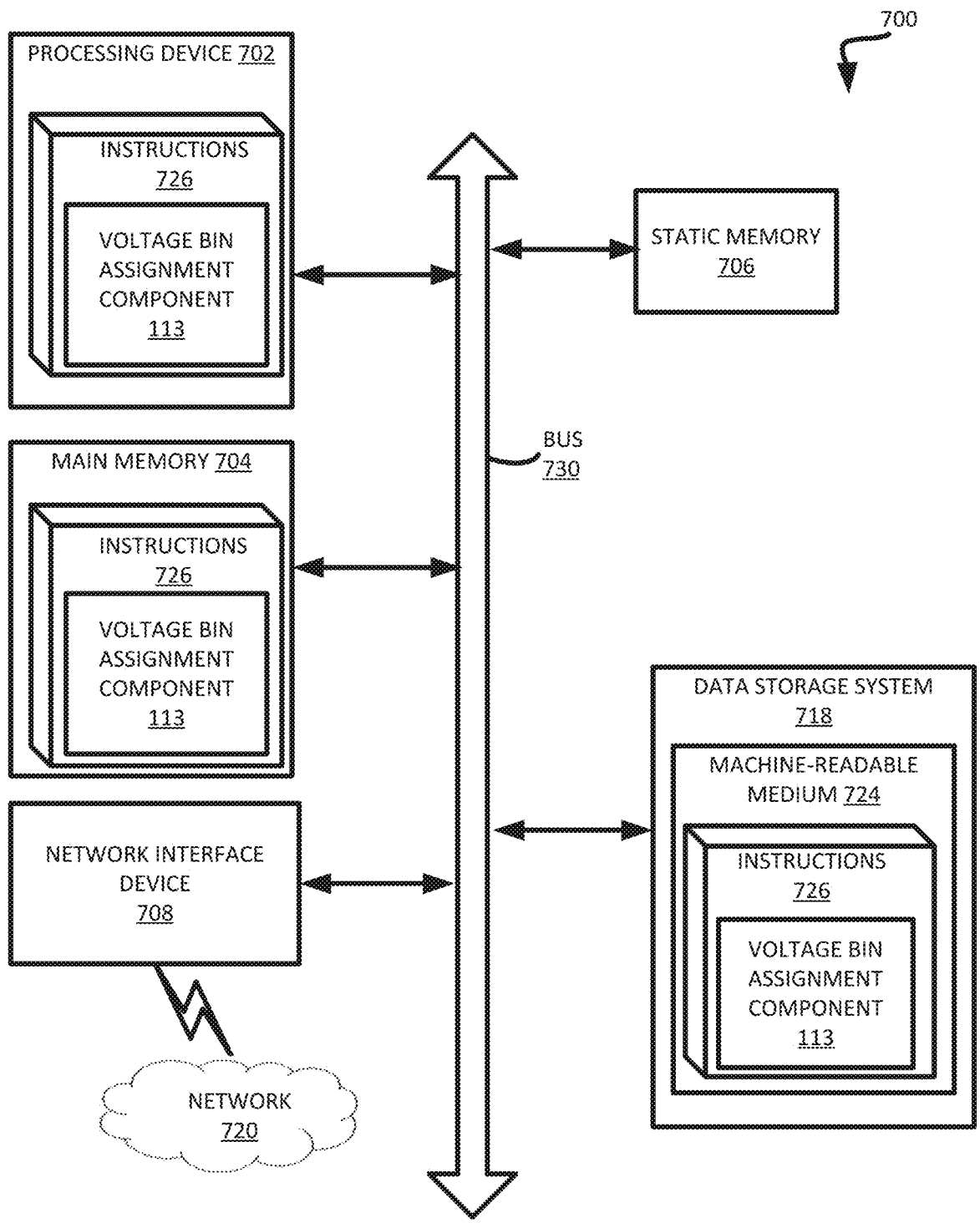
FIG. 7 illustrates an example machine of a computer system within which a set of instructions, for causing the machine to perform any one or more of the methodologies discussed herein, can be executed.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to voltage bin assignment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to voltage bin assignment component 113 of FIG. 1. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device; and a processing device, operatively coupled to the memory device, to perform operations comprising:

detecting a power on event associated with the memory device, the power on event indicating that power has been restored to the memory device;

estimating a duration of a power off state preceding the power on event associated with the memory device; and updating voltage bin assignments of a plurality of blocks associated with the memory device based on the duration of the power off state.

2. The system of claim 1, wherein the operations further comprise:
scanning one or more blocks of the plurality of blocks of the memory device to determine a corresponding time after program (TAP) associated with each block of the one or more blocks; and
using the corresponding TAP of the each block to estimate the duration of the power off state preceding the power on event.

3. The system of claim 2, wherein the corresponding TAP of the each block corresponds to an age of the each block.

4. The system of claim 2, wherein estimating the duration of the power off state preceding the power on event further comprises:
identifying, for each block of the one or more bocks, a corresponding existing voltage bin assignment determined before the power off state of the memory device; and
determining whether the corresponding TAP of the each block matches the corresponding existing voltage bin assignment of the each block.

5. The system of claim 2, wherein estimating the duration of the power off state preceding the power on event further comprises:
determining whether at least one block of the scanned one or more blocks has transitioned from a first voltage bin to a second voltage bin during the power off state of the memory device.

6. The system of claim 2, wherein a TAP of each block reflects a power on time of the memory device and a power off time of the memory device.

7. The system of claim 1, wherein updating the voltage bin assignments of the plurality of blocks further comprises:
assigning, to each block of the plurality of blocks and based on a time after programing (TAP) of the each block, a voltage bin of a plurality of voltage bins associated with the memory device, wherein each voltage bin of the plurality of voltage bins is associated with a corresponding range of TAP values.

8. The system of claim 7, wherein the processing device is to perform further operations comprising:
identifying an oldest block associated with a youngest voltage bin of the plurality of voltage bins;
determining, by scanning the identified block, a second voltage bin corresponding to an age of the identified block after the power on event of the memory device; and
responsive to determining that the youngest voltage bin matches the second voltage bin, aborting the scanning of the one or more blocks of the memory device.

9. The system of claim 7, wherein the processing device is to perform further operations comprising:
identifying an oldest block associated with a youngest voltage bin of the plurality of voltage bins;
determining, by scanning the identified block, a second voltage bin corresponding to a time after program (TAP) of the identified block after the power on event of the memory device; and
responsive to determining that the youngest voltage bin does not match the second voltage bin:
identifying a youngest block associated with the youngest voltage bin of the plurality of voltage bins;
determining, by scanning the youngest block, a third voltage bin corresponding to a TAP of the youngest block after the power on event of the memory device; and
responsive to determining that the second voltage bin matches the third voltage bin, assigning the second voltage bin to each block associated with the youngest voltage bin.

10. The system of claim 7, wherein the processing device is to perform further operations comprising:
identifying an oldest block associated with a youngest voltage bin of the plurality of voltage bins;
determining, by scanning the identified block, a second voltage bin corresponding to a time after program (TAP) of the identified block after the power on event of the memory device; and
responsive to determining that the youngest voltage bin does not match the second voltage bin and that the second voltage bin is not adjacent to the youngest voltage bin:
assigning the second voltage bin to each block associated with the youngest voltage bin; and
assigning the second voltage bin to each block associated with a voltage bin that is younger than the second voltage bin.

11. The system of claim 7, wherein the processing device is to perform further operations comprising:
identifying a youngest block associated with a youngest voltage bin of the plurality of voltage bins;
determining, by scanning the youngest block, a current time after program (TAP) of the identified block after the power off state of the memory device;
determining an offset based on the current TAP of the youngest block and a second TAP of the youngest block determined before the power off state of the memory device;
updating a TAP of each block of the plurality of blocks by adding the offset to the TAP of each block of the plurality of blocks of the memory device; and
performing voltage bin assignments to each block of the plurality of blocks based on the updated TAP of each block.

12. A method comprising:
detecting, by a processing device, a power on event associated with a memory device, the power on event indicating that power has been restored to the memory device;
estimating a duration of a power off state preceding the power on event associated with the memory device; and
updating voltage bin assignments of a plurality of blocks associated with the memory device based on the duration of the power off state.

13. The method of claim 12, further comprising:
scanning one or more blocks of the plurality of blocks of the memory device to determine a corresponding time after program (TAP) associated with each block of the one or more blocks; and
using the corresponding TAP of the each block to estimate the duration of the power off state preceding the power on event.

14. The method of claim 13, wherein estimating the duration of the power off state preceding the power on event further comprises:

identifying, for each block of the one or more bocks, a corresponding existing voltage bin assignment determined before the power off state of the memory device; and determining whether the corresponding TAP of the each block matches the corresponding existing voltage bin assignment of the each block.

15. The method of claim 13, wherein estimating the duration of the power off state preceding the power on event further comprises:

determining whether at least one block of the scanned one or more blocks has transitioned from a first voltage bin to a second voltage bin during the power off state of the memory device.

16. The method of claim 12, wherein updating the voltage bin assignments of the plurality of blocks further comprises:

assigning, to each block of the plurality of blocks and based on a time after programing (TAP) of the each block, a voltage bin of a plurality of voltage bins associated with the memory device, wherein each voltage bin of the plurality of voltage bins is associated with a corresponding range of TAP values.

17. A non-transitory computer-readable storage medium comprising instructions that, when executed by a processing device, cause the processing device to perform operations comprising:

detecting a power on event associated with a memory device, the power on event indicating that power has been restored to the memory device;

estimating a duration of a power off state preceding the power on event associated with the memory device; and updating voltage bin assignments of a plurality of blocks associated with the memory device based on the duration of the power off state.

18. The non-transitory computer-readable storage medium of claim 17, wherein the operations further comprise:

scanning one or more blocks of the plurality of blocks of the memory device to determine a corresponding time after program (TAP) associated with each block of the one or more blocks; and using the corresponding TAP of the each block to estimate the duration of the power off state preceding the power on event.

19. The non-transitory computer-readable storage medium of claim 17, wherein updating the voltage bin assignments of the plurality of blocks further comprises:

assigning, to each block of the plurality of blocks and based on a time after programing (TAP) of the each block, a voltage bin of a plurality of voltage bins associated with the memory device, wherein each voltage bin of the plurality of voltage bins is associated with a corresponding range of TAP values.

20. The non-transitory computer-readable storage medium of claim 19, wherein the operations further comprise:

identifying an oldest block associated with a youngest voltage bin of the plurality of voltage bins;

determining, by scanning the identified block, a second voltage bin corresponding to an age of the identified block after the power on event of the memory device; and responsive to determining that the youngest voltage bin matches the second voltage bin, aborting the scanning of the one or more blocks of the memory device.

* * * * *